United States Patent
Rastegar et al.

(10) Patent No.: US 7,272,293 B2
(45) Date of Patent: *Sep. 18, 2007

(54) DEVICE HAVING A CASING AND /OR INTERIOR ACTING AS A COMMUNICATION BUS BETWEEN ELECTRONIC COMPONENTS

(75) Inventors: Jahangir S. Rastegar, Stony Brook, NY (US); Harbans Dhadwal, Setauket, NY (US); Thomas Spinelli, East Northport, NY (US)

(73) Assignee: Omnitek Partners LLC, Bayshore, NY (US)

( * ) Notice: Subject to any disclaimer, the term of this patent is extended or adjusted under 35 U.S.C. 154(b) by 115 days.

This patent is subject to a terminal disclaimer.

(21) Appl. No.: 10/639,001

(22) Filed: Aug. 12, 2003

(65) Prior Publication Data

US 2005/0036273 A1    Feb. 17, 2005

(51) Int. Cl.
*G02B 6/00* (2006.01)
*H04B 10/00* (2006.01)
*H04B 10/12* (2006.01)

(52) U.S. Cl. ............... 385/147; 398/141; 398/142; 398/153

(58) Field of Classification Search ........ 398/140–172; 385/147
See application file for complete search history.

(56) References Cited

U.S. PATENT DOCUMENTS

| | | | | |
|---|---|---|---|---|
| 5,051,601 | A | * | 9/1991 | Atobe et al. ............... 250/551 |
| 5,390,351 | A | * | 2/1995 | Di Giulio et al. ........... 709/225 |
| 6,733,189 | B2 | * | 5/2004 | Hurt et al. ..................... 385/92 |
| 6,892,644 | B2 | * | 5/2005 | Rastegar et al. ............ 102/213 |

* cited by examiner

*Primary Examiner*—John D. Lee
*Assistant Examiner*—Rhonda S. Peace (57) ABSTRACT

A device including: at least two electronic/electrical components; and a casing, the casing having at least a portion thereof acting as a communication bus for connecting the at least two electronic/electrical components.

29 Claims, 6 Drawing Sheets

DEVICE HAVING A CASING AND /OR INTERIOR ACTING AS A COMMUNICATION BUS BETWEEN ELECTRONIC COMPONENTS

BACKGROUND OF THE INVENTION

1. Field of the Invention

The present invention relates generally to devices, and more particularly, to devices having a casing and/or interior that act as a communication bus between at least two components of the device. For purposes of this disclosure, a device is any article having a casing which houses two or more electrical/electronic components. Also for purposes of this disclosure, a communication bus is anything that transmits one or more signals between two or more components. Such transmission may be one-way or two-way. Thus, the transmission may be a simple point-to-point link between two components or a point to many links between several components. Furthermore, the transmission may be such that the transmitted signal(s) are available to any components on the communication bus. Still further, the communication bus may be more than one media, such as a waveguide, potting material, and/or free space in the casing (including the casing itself).

2. Prior Art

Electronic devices typically have a casing or shell in which electronic/electrical components are housed. The electronic/electrical (collectively referred to hereinafter as "electronic" or "electronics") components interact with each other and/or other devices via internal wiring (which includes printed circuit boards). While the wiring has its advantages, it suffers from certain disadvantages such as susceptibility to noise, brittleness, potential for high bit error, takes up a large amount of space in the interior of the casing or shell, can suffer from poor connections, and may be susceptible to impact and shock. These disadvantages are amplified in certain devices that house electronic components and operate in harsh environments.

SUMMARY OF THE INVENTION

It is an object of the present invention to provide methods and devices that overcome the disadvantages of the wiring used to link components in devices having electronic components.

Accordingly, a device is provided which comprises: at least two electronic/electrical components; and a casing, the casing having at least a portion thereof acting as a communication bus for connecting the at least two electronic/electrical components.

At least a portion of the casing can be an optical waveguide where one of the at least two electronic/electrical components comprises a transmitter operatively connected to the optical waveguide for transmitting optical signals into the optical waveguide, the other of the at least two electronic/electrical components comprises a detector for detecting the optical signals from the waveguide.

Alternatively, at least a portion of the casing can be an ultrasonic waveguide where one of the at least two electronic/electrical components comprises an ultrasonic generator operatively connected to the ultrasonic waveguide for transmitting ultrasound signals into the ultrasonic waveguide, the other of the at least two electronic/electrical components comprises a detector for detecting the ultrasonic signals from the waveguide.

The portion of the casing acting as a communication bus can comprise a waveguide for transmitting signals between the at least two electronic/electrical components. The waveguide can comprise an entirety of the casing. Alternatively, the casing can comprise an outer portion where the waveguide is formed on an inner surface of the outer portion. The waveguide can be formed on a majority of the inner surface of the outer portion. Alternatively, the waveguide can be formed in one or more strips on the inner surface of the outer portion. At least one of the one or more strips can be formed in a channel on the inner surface of the outer portion.

Where at least a portion of the casing is an optical waveguide, at least one of the at least two electronic/electrical components comprises a transmitter operatively connected to the waveguide for transmitting at least one signal through the waveguide. Alternatively, at least one of the at least two electronic/electrical components comprises a detector operatively connected to the waveguide for detecting the at least one signal.

The device can further comprise means for directly adhering at least one of the at least two electronic/electrical components to the waveguide. Where the waveguide is an optical waveguide, the means for directly adhering can comprise an optical quality adhesive for adhering the one of the at least two electronic/electrical components directly to the waveguide. Alternatively, the device can further comprise fastening means for mechanically fastening at least one of the at least two electronic/electrical components on the waveguide. The fastening means can comprise a bracket having the at least one of the at least two electronic/electrical components fastened to a first portion and the waveguide fastened to another portion.

Also provided is a device comprising: means for housing at least two internal electronic/electrical components; and means for communicating a signal between the at least two internal electronic/electrical components through at least a portion of the means for housing the at least two internal electronic/electrical components.

Still provided is a device comprising: a casing for holding two or more electronic/electrical components; and a communication bus formed at least in part by the casing; wherein the two or more electrical/electronic components are operatively connected to the communication bus and capable of transmitting and detecting a signal on the communication bus.

Still provided is a method for communicating a signal between two or more electronic/electrical components in a device having a casing. The method comprising: providing the casing with at least a portion acting as a communication bus; and operatively connecting the two or more electronic/electrical components to the communication bus.

The method can further comprise transmitting a signal on the communication bus for detection by at least one of the two or more electronic/electrical components. The transmitting can comprise transmitting an optical or ultrasound signal on the communication bus.

The providing can comprise fabricating at least a portion of the casing from a material that acts as the communication bus.

The operatively connecting can comprise adhering at least one of the two or more electronic/electrical components to the at least a portion of the casing acting as a communication bus. Alternatively, the operatively connecting comprises fastening at least one of the two or more electronic/electrical components to the at least a portion of the casing acting as a communication bus.

Still provided is a computer comprising: a casing, at least a portion of which has a communication bus formed therein; and two or more components operatively connected to the communication bus for at least one of transmitting and detecting a signal on the communication bus. At least one of the two or more components can be a transmitter for transmitting a signal on the communication bus. At least one of the two or more components can be a detector for detecting a signal transmitted on the communication bus.

Still provided is a cell phone comprising: a casing having at least a display formed thereon, at least a portion of the casing having a communication bus formed therein; and two or more components operatively connected to the communication bus for at least one of transmitting and detecting a signal on the communication bus. At least one of the two or more components can be a transmitter for transmitting a signal on the communication bus. At least one of the two or more components can be a detector for detecting a signal transmitted on the communication bus.

Still provided is a device comprising: a casing, the casing having at least a portion thereof acting as a communication bus; and a transmitter operatively connected to the communication bus for transmitting a signal on the communication bus. The device can further comprise a detector operatively connected to the communication bus for detecting the signal on the communication bus.

Still provided is a device comprising: a casing, the casing having at least a portion thereof acting as a communication bus; and a detector operatively connected to the communication bus for detecting a signal on the communication bus. The device can further comprise a transmitter operatively connected to the communication bus for transmitting the signal on the communication bus.

Still provided is a device comprising: a casing; a communication bus disposed in the casing; and a window formed on at least a portion of the casing through which an input signal is transmitted from an exterior of the casing to the communication bus.

Still provided is a method for inputting a signal to an interior of a device where the method comprises: inputting a signal through at least a portion of a casing of the device; and transmitting at least a portion of the signal to one of a communication bus or internal component. The signal can be useful for inputting data to the internal component.

Still provided is a device comprising: a casing, at least a portion of which contains a potting material; first and second electronic/electrical components, at least one of which is at least partially disposed in the potting material; a transmitter disposed on the first electronic/electrical component for transmitting a signal from the first electronic/electrical component and at least partially through the potting material; and a receiver disposed on the second electronic/electrical component for receiving the signal and transmitting the signal or representative of the signal to the second electronic/electrical component.

The potting material can be selected from a group consisting of a solid, a gel, and a liquid. Where the potting material is the solid, the solid can be an epoxy resin. The signal can be an infrared signal. The casing can include a window through which an input signal is transmitted from an exterior of the casing to at least one of the potting material, first electronic/electrical component, and second electronic/electrical component.

Still provided is a method for communicating a signal between first and second electronic/electrical components contained in a casing of a device. The method comprising: encasing at least a portion of one of the first and second electronic/electrical components in a potting material in the casing; and transmitting the signal at least partially through the potting material from the first electronic/electrical component to the second electronic/electrical component.

The method can further comprise inputting a signal through at least a portion of the casing to at least one of the potting material, first electronic/electrical component, and second electronic/electrical component.

Still yet provided is a device comprising: a casing, at least a portion of which contains a potting material; first and second electronic/electrical components; a transmitter disposed on the first electronic/electrical component for transmitting a signal; and a receiver disposed on the second electronic/electrical component for receiving the signal; wherein the signal is at least partially transmitted through the potting material.

BRIEF DESCRIPTION OF THE DRAWINGS

These and other features, aspects, and advantages of the apparatus and methods of the present invention will become better understood with regard to the following description, appended claims, and accompanying drawings where:

DETAILED DESCRIPTION OF THE PREFERRED EMBODIMENT

Although the invention is particularly suited to optical signal communication between electronic components, such is discussed by way of example only. Those skilled in the art will appreciate that other communication means can also be utilized, such as ultrasound. Further, although a generic casing, computer casing, and cellular phone casing are illustrated and discussed herein, such are given by way of example only, those skilled in the art will appreciate that the devices and methods of the present invention can be utilized in any device having an interior which houses at least two interconnected electronic components.

Figure 1:
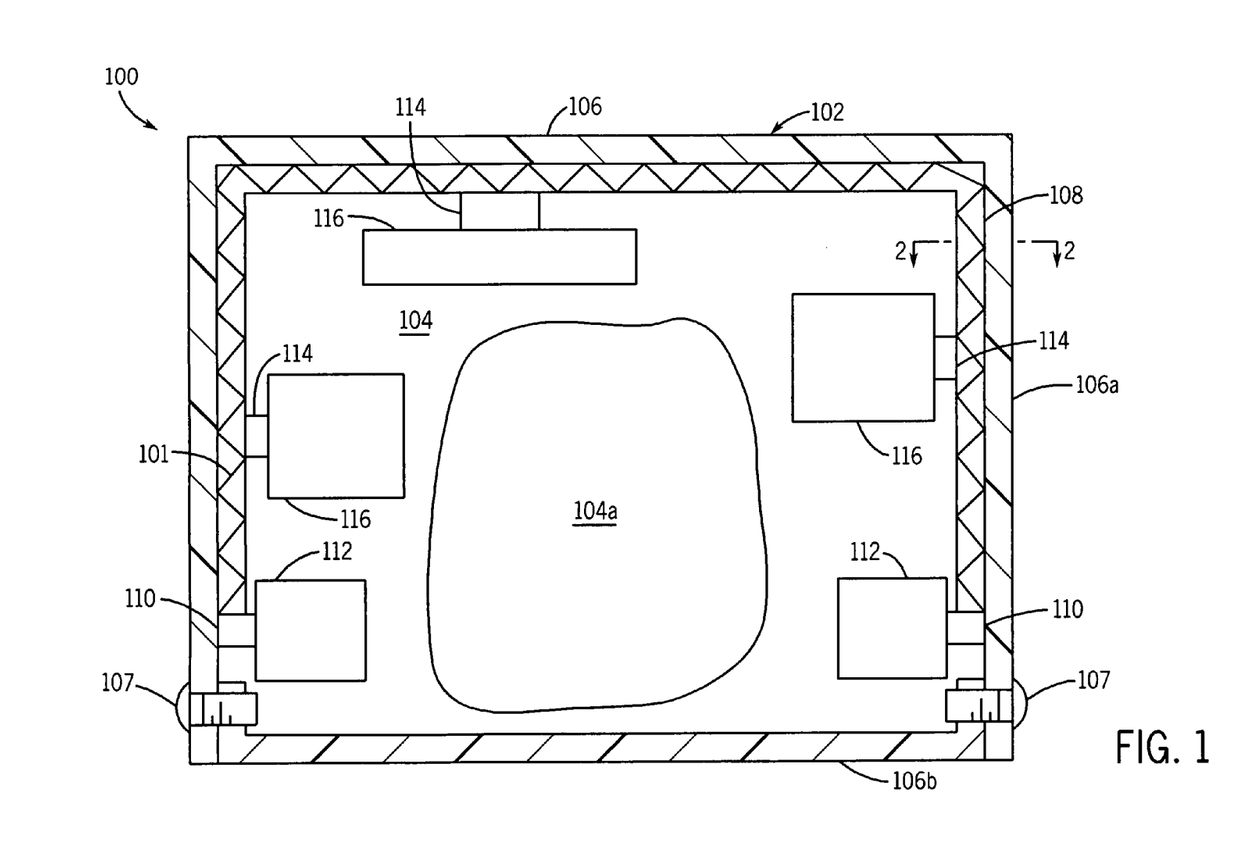
FIG. 1 illustrates a schematic view of a generic electronic device having a casing nose and two or more electronic components according to a first embodiment.

Referring now to FIG. 1, there is shown a generic device generally referred to by reference numeral 100. The generic device 100 has a casing 102 that defines an interior 104. The casing 102 preferably has a metal, plastic, or composite outer portion 106 and a communication bus, such as waveguide portion 108. The casing 102 is shown generically as rectangular in shape, however, those skilled in the art will appreciate that it may have any shape. Furthermore, the casing 102 is shown having a two-piece construction, upper shell 106a and lower platform 106b joined together with screws 107. However, those skilled in the art will appreciate that the casing 102 can be constructed from one or more pieces, and if more than one piece, the pieces can be joined or fastened in any manner known in the art, such as by welding, gluing, riveting, or with interference or snaps.

Figure 2A:
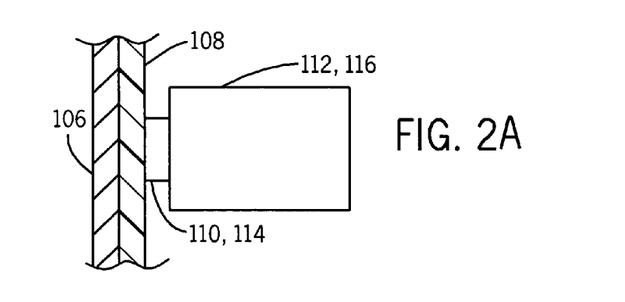
FIGS. 2A, 2B, and 2C illustrate sectional views of a wall of the casing of FIG. 1 as taken along line 2—2 in FIG. 2, FIGS. 2A, 2B, and 2C representing three alternative wall/waveguide configurations.
Figure 2B:
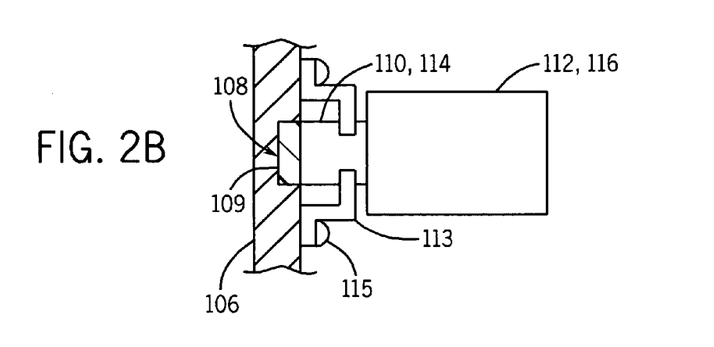
Figure 2C:
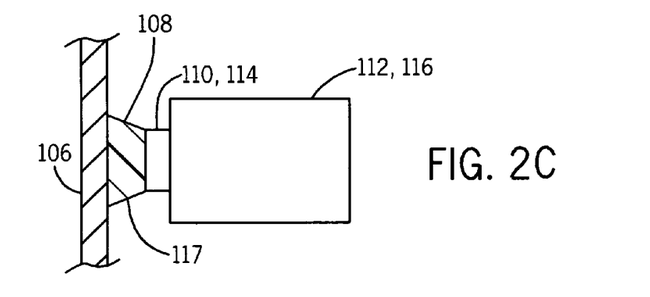

The waveguide portion 108 is preferably optical glass having appropriate cladding as is known in the art. However, the waveguide portion 108 can also be a synthetic material, such as an acrylic, polycarbonate, or epoxy. The inner waveguide material can be formed on the casing 102 by any methods known in the art, such as by casting, machining, or depositing. The waveguide portion 108 can be disposed on the entire inner surface of the outer portion 106 of the casing 102 (or a portion thereof) as shown in FIG. 2A. Alternatively, the waveguide portion 108 can be arranged in strips 117, formed on the outer portion 106 of the casing 102 as is shown in FIG. 2C, or in channels 111 formed in the outer portion 106 of the casing 102 as is shown in FIG. 2B. Alternatively, the waveguide portion 108 can make up the entire shell 102 (no outer portion 106 is used), which can be uncoated or have a coating, such as an opaque paint.

At least one transmitter 110 is arranged on the waveguide portion 108 or proximate thereto such that a signal 101, such as an optical signal can be transmitted to the waveguide portion 108. The transmitter 110 can be integral with a corresponding electronic component 112 or connected thereto. At another location on the waveguide portion 108 are located detectors 114 for detecting the optical signals in the waveguide portion 108. Each detector 114 is either integral with or connected to another electronic/electrical component 116. Thus, those skilled in the art will appreciate that any component can communicate with another component through the waveguide portion 108, which acts as a communication bus. Of course, each of the components can have both a transmitter 110 and detector 114 such that a two-way communication can be achieved. Furthermore, each of the transmitter and detector can itself be considered a component operatively connected to the waveguide portion 108 (communication bus). Although not shown, mutiplexers and demultiplexers can be used such that certain components can operate at selected frequencies and/or wavelengths and not interfere with other components on the bus. Similarly, other components known in the art for transmission of signals through a waveguide can be used, such as an amplifier (not shown) for amplifying a signal between components. The transmitters 110 and detectors 114 can be mounted to the waveguide portion 108 directly as is known in the art such as by an optical quality adhesive, as shown in FIGS. 2A and 2C. Alternatively, the transmitter 110 and detectors 114 can be mounted to the waveguide portion 108 or the outer portion 106 of the casing 102 by mechanical means, such as a bracket 113 and screws 115 as is shown in FIG. 2B. Also, the transmitters and detectors can be both adhered and mechanically fastened to the waveguide portion 108. As another alternative, the components can be connected to the waveguide portion 108 by optical fibers (not shown) or the like.

Those skilled in the art will appreciate that the interior 104 is not cluttered with components and internal wiring resulting in more components being able to occupy a given interior size or the device 100 being made smaller than a conventional device having the same number of internal components. In the device shown in FIG. 1, portion 104a of the interior 104 can be used to house additional components or the device can be reduced in size to eliminate portion 104a or a portion thereof. Other advantages include:

The optical transmission provides robust, interference free channels between physically disconnected components/systems;

The optical transmission is naturally resistant to very high g-loads and harsh environments;

For shorter distances between the transmitter and receiver, the system is inexpensive and extremely low bit rate error (better than $10^{-12}$) can be readily achieved; and The need for wires and related problems and space requirements are eliminated.

Alternatively, ultrasound can be used to communicate between the internal components 112, 116. In which case, the casing 102 or a portion thereof needs to be able to carry an ultrasound signal between components. Such a casing 102, or portion thereof, may be constructed from a suitable metal. In the case of ultrasound, an ultrasonic generator is used to place signals on the "bus" (casing 102) and a corresponding ultrasonic detector detects the ultrasonic signals and relays them to an appropriate component. Of course, the casing may also be a synthetic material having portions of suitable materials for carrying an ultrasound signal. As discussed above with regard to the optical signal configuration, each component can have both an ultrasonic generator and detector such that two-way communication between components is possible and mutiplexers and demultiplexers can be utilized such that certain components can operate at selected frequencies and/or wavelengths and not interfere with other components on the bus.

In another embodiment, the casing 102 is a casing of a CPU of a computer 200. In yet another implementation, the casing 102 is a casing of a cellular telephone 300. As discussed above, such embodiments are given by way of example only and not to limit the scope or spirit of the present invention.

Figure 3:
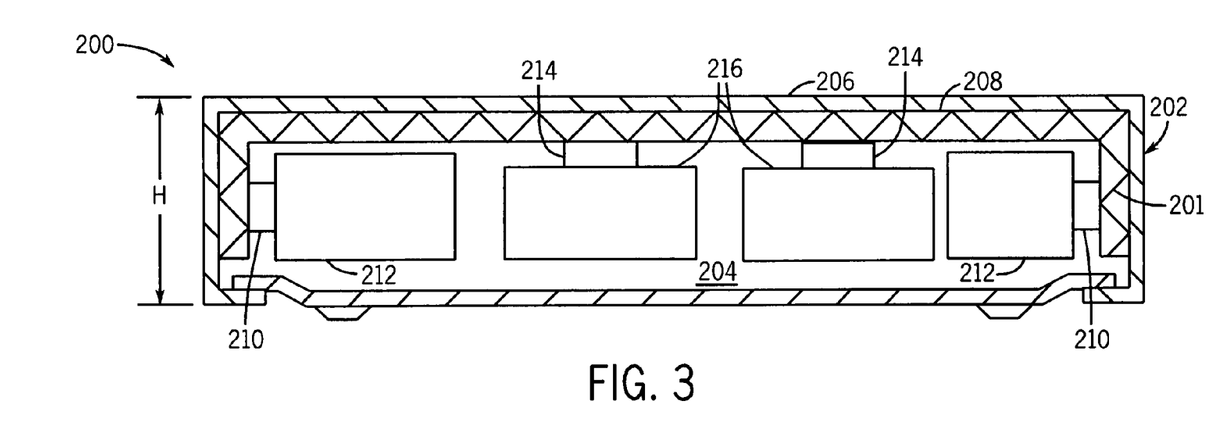
FIG. 3 illustrates a sectional view of a computer CPU casing according to an embodiment.
Figure 4:
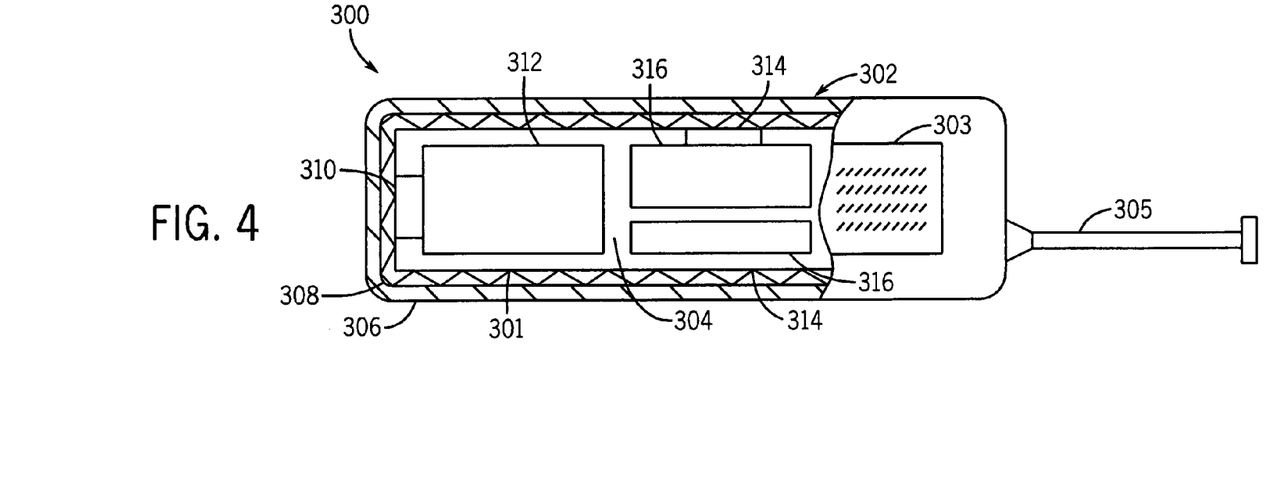
FIG. 4 illustrates a partial sectional view of a cellular telephone according to an embodiment.

Referring now to FIGS. 3 and 4, there is shown a computer CPU 200 and cellular telephone 300, respectively, in which similar number series denote similar features to that of FIG. 1 (i.e., casing 102 corresponds with casings 202 and 302, etc.). Those skilled in the art will appreciate that the casings 202, 302 can be made smaller than a conventional counterpart device having the same number of internal components or be able to house more components in the same size casing. Thus, the present invention can provide a miniaturization of electronic devices, particularly portable electronic devices while eliminating the problems associated with wiring, such as signal speed, poor connections, and failure over time due to brittleness and other insulation failures. The waveguide portion 108 also provides for a flexible design and layout of the electronic components as well as the ability to easily add a component on the communication bus (waveguide portion 108) of the device. For example, where the waveguide portion 108 is deposited on a substantial portion of the inner surface of the casing 102, the electronic components can be distributed or added on any portion of the casing where the waveguide portion 108 is deposited.

Examples of other devices not shown which can benefit from the methods disclosed herein are PDA's (personal digital assistants), cordless telephones, VCR's, portable CD and MP3 players, digital cameras, DVD players, and televisions. Such a listing is given by way of example only and is not intended to be exhaustive of any other electronic devices. Although discussed as electronic components, such components can also have a mechanical or chemical function as well as an electronic/electrical function. These mechanical and/or chemical functions can be housed in a portion of the interior of the casing that has been freed up by having the electronic components distributed on the casing.

Referring specifically to FIG. 3, there is shown a computer CPU 200 having a casing 202 defining an interior 204. The casing has an outer portion 206 and a waveguide portion 208 that carries a signal 201. Transmitters 210 and detectors 214 are operatively connected to the waveguide portion 208 and mounted to respective electronic components 212, 216. Those skilled in the art will appreciate that the computer CPU 200 can be made smaller, particularly, thinner in height (H) than conventional CPU's that utilize conventional wiring between components. Alternatively, the computer CPU 200 can house more components than would be possible for a similarly sized CPU of the prior art that utilizes conventional wiring between components. Furthermore, the CPU 200 has a more versatile design and can be upgraded with additional components at any place on the waveguide portion.

Referring specifically to FIG. 4, there is shown a cell phone 300 having a casing 302 defining an interior 204. The casing also carries an antenna 305, a display 303, and a keyboard and other features (not shown). The casing 302 has an outer portion 306 and a waveguide portion 308 that carries a signal 301. Transmitters 310 and detectors 314 are operatively connected to the waveguide portion 308 and mounted to respective electronic components 312, 316. Those skilled in the art will appreciate that the cell phone 300 can be miniaturized as compared to conventional cell phones that utilize conventional wiring between components. Alternatively, the cell phone 300 can house more components than would be possible for a similarly sized cell phones of the prior art that utilizes conventional wiring between components. Additionally, the cell phone 300 is better able to withstand shock, for example from dropping the cell phone 300 on a hard surface. The increased shock resistance is due to the elimination of brittle wiring, including printed circuit boards and wiring harnesses and connecters.

Figure 5:
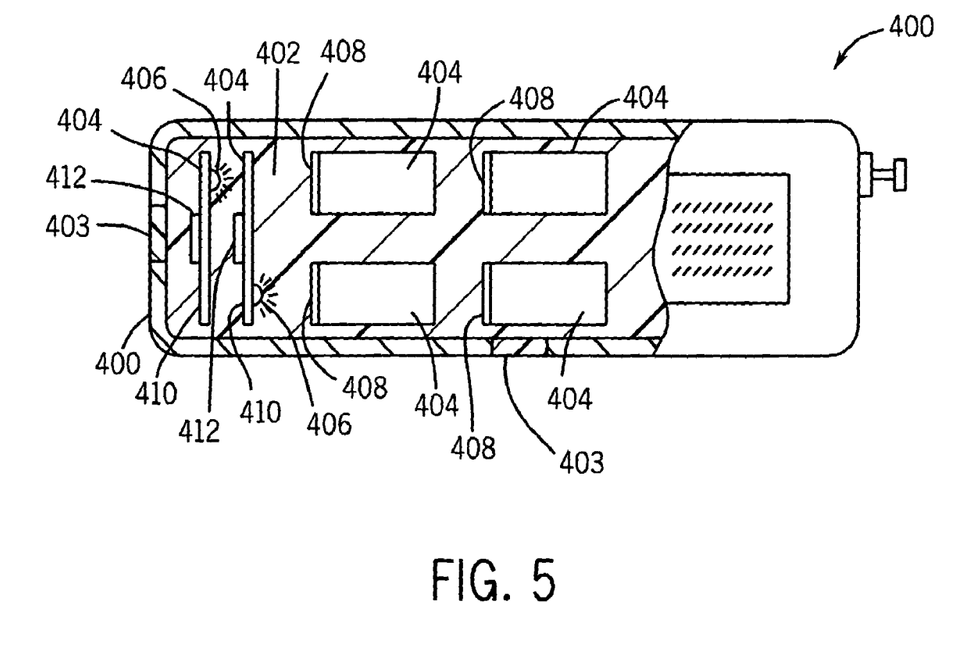
FIG. 5 illustrates a partial sectional view of a cellular telephone according to another embodiment of the present invention.
Figure 6:
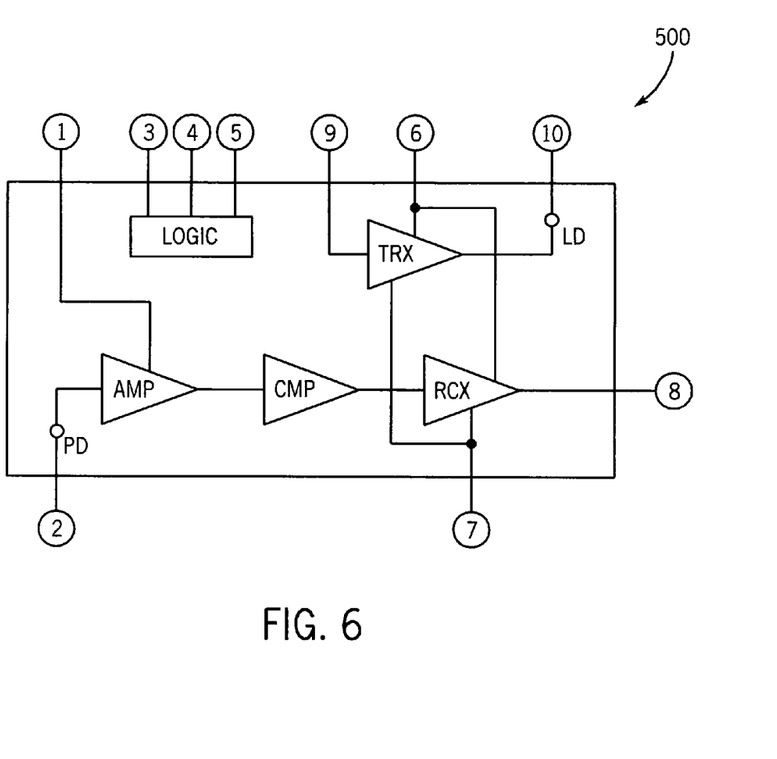
FIG. 6 illustrates a schematic electrical diagram of an infrared (IR) transceiver for use with the cellular telephone of FIG. 5.

Referring now to FIGS. 5 and 6, another embodiment of a device is shown, the device being in the form of a cellular telephone and referred to generally by reference numeral 400. Typically, electrical/electronic components of some devices, such as projectiles, are encased in a potting material, such as an epoxy, to harden the components against noise and shock due to the high acceleration and/or impact experienced by the projectile. In the embodiment of FIGS. 5 and 6, the potting material 402, which can be a solid, such as an epoxy, a gel, or a liquid is disposed within a casing 401 of the cellular telephone and is used as a communication bus between electrical/electronic components 404. The communication can be wholly within the potting material 402 or may be partially within the potting material 402 and partially in free space. Although many devices can be subjected to such noise and/or shock, a cellular telephone is described by way of example because of its tendency to be dropped or otherwise subjected to shock.

The communication through the potting material is carried out with a transmitter 406, which outputs any wavelength radiation that can propagate through the potting material 402 and detected by a receiver 408. It is preferred that the potting material 402 be a solid, such as an epoxy to provide hardening of the cellular telephone to shock and noise and it is further preferred that the radiation used as a communication medium is IR energy, preferably from a IR diode. In such an example, the epoxy need not be transparent or substantially transparent as long as it can carry an IR signal over a required distance, such as several hundred mm or less. An example of such an epoxy is Dolphon® CC-1024-A Low Viscosity Potting and Casting Epoxy Resin with RE-2000 Reactor mixed at a ratio of 10 parts resin to 1 part reactor, each of which is distributed by John C. Dolph Company. The same epoxy resin and reactor can be used for the waveguide portions 108, 208, or 308 discussed above with regard to FIGS. 1, 3, and 4.

IR technology is well known in the art, particularly in the art of remote control of electronic consumer goods. The IR data association (IrDA®) has standards for communicating data via short-range infrared transmission. Transmission rates fall within three broad categories SIR, MIR and FIR, SIR (Serial Infrared) speeds cover transmission speeds normally supported by an RS-232 port. MIR (Medium Infrared) usually refers to speeds of 0.576 Mb/s to 1.152 Mb/s. FIR (Fast Infrared) denotes transmission speeds of about 4 Mb/s. The standard has been modified for faster transmission speeds up to 16 Mb/s (referred to as very fast Infrared VFIR). Although not preferred, visible light, for example from a laser diode, may also be used to transmit communication signals through the potting material 402.

The transmitters 406 may be carried on printed circuit boards 410 which may also be encased in the potting material 402 or disposed freely throughout the potting material 402. The printed circuit boards each 410 preferably carry their own power supply, such as a battery 412 to eliminate internal wiring. Each of the electronic/electrical components 404 has a receiver 408 for communicating with the transmitters 406. As discussed above with regard to the first embodiment, each of the electrical/electronic components 404 preferably have a receiver 408 and a transmitter 406 such that they can carry out a two-way communication. An example of such a transceiver module 500 is shown in the schematic diagram of FIG. 6. FIG. 6 shows an (IrDA®) transceiver manufactured by Sharp Inc. (2P2W1001YP) which is relatively inexpensive and contains a high speed, high efficiency low power consumption light emitting diode (LD), a silicon PIN photodiode (PD) and a low power bipolar integrated circuit. The circuit contains an LED driver (TRX) and a receiver circuit (RCX) that delivers 4 Mb/s operation for distances of 1 meter. The LED emitter transmits at a nominal wavelength of 880 nm with a radiant intensity in the range of 100 to 500 mW.sr$^{-1}$, with a radiation angle of +/−15 degrees. The pin photodiode has an integrated amplifier (AMP) and comparator (CMP), which provide a fixed voltage output over a broad range of input optical power levels and data rates. The same or similar transceiver module 500 can also be used for the other embodiments described above with regard to FIGS. 1, 3, and 4.

The casing 402 can also be provided with a window portion 403, as shown in FIG. 5, which can be used to upload or input data or instructions into components of the cellular telephone through the potting material 402 (or through the waveguide portions 108, 208, and 308 discussed above). In a preferred implementation, the window portion 403 is in optical communication with the waveguide portion 108, 208, 308 or potting material 402 and transmits any input signals to the appropriate components on the interior of the cellular telephone. Although described in terms of a transparent window 403 and signal, the input signal can be any signal that propagates through the waveguide portion 108, 208, 308 or potting material 402, such as an IR or ultrasound signal. Furthermore, the window 403 does not have to be a transparent window but merely a portion of the casing, which is capable of transmitting a signal from the exterior of the cellular telephone to one or more components on the interior of the cellular telephone.

Figure 7:
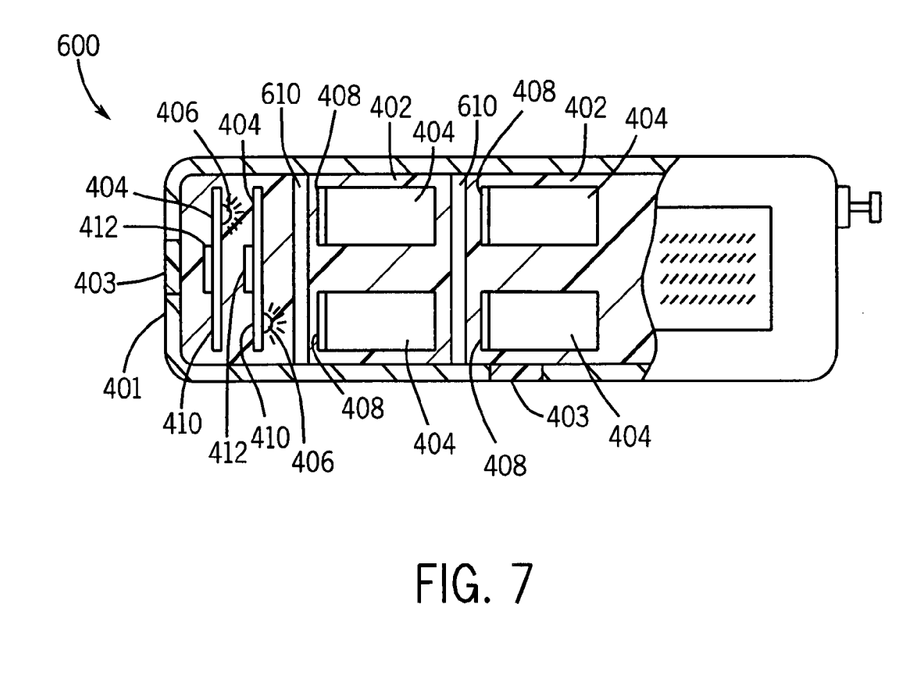
FIG. 7 illustrates a cellular telephone according to another embodiment of the present invention.

Referring now to FIG. 7, there is shown a cellular telephone according to another embodiment of the present invention, in which similar reference numerals from FIG. 5 denote similar features, the cellular telephone of FIG. 7 being referred to generally by reference numeral 600. FIG. 7 is similar to that of FIG. 5 with the exception that the potting material does not have to completely encase a portion of the cellular telephone's interior. The interior of the cellular telephone includes portions of free space 610 (which may be filled with air or other gases or may be evacuated. Although all of the components 404, 408 are shown encased in the potting material 402, they can also be provided in the free space 610 or partially in the free space 610. Thus, the communication between components is not only through the potting material 402 but can also be done through the free space 610 inside the cellular telephone.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be construed to cover all modifications that may fall within the scope of the appended claims.

What is claimed is:

1. A device other than a projectile, the device comprising:
   a plurality of electronic/electrical components; and
   a casing, the casing having at least a portion thereof acting as a communication bus for transmitting a signal in a point-to-many links manner between the plurality of electronic/electrical components, wherein the transmitted signal is available to each of the plurality of electronic/electrical components on the communication bus.

2. The device of claim 1, wherein at least a portion of the casing is an optical waveguide where one of the a plurality of electronic/electrical components comprises a transmitter operatively connected to the optical waveguide for transmitting optical signals into the optical waveguide, and another of the at least two electronic/electrical components comprises a detector for detecting the optical signals from the waveguide.

3. The device of claim 2, wherein at least one of the plurality of electronic/electrical components comprises a transmitter operatively connected to the waveguide for transmitting the signal through the waveguide.

4. The device of claim 3, wherein at least one of the plurality of electronic/electrical components comprises a detector operatively connected to the waveguide for detecting the at least one signal.

5. The device of claim 2, further comprising means for directly adhering at least one of the plurality of electronic/electrical components to the waveguide.

6. The device of claim 5, wherein the waveguide is an optical waveguide and the means for directly adhering comprises an optical quality adhesive for adhering the one of the plurality of electronic/electrical components directly to the waveguide.

7. The device of claim 2, further comprising fastening means for mechanically fastening at least one of the plurality of electronic/electrical components on the waveguide.

8. The device of claim 7, wherein the fastening means comprises a bracket having the at least one of the plurality of electronic/electrical components fastened to a first portion and the waveguide fastened to another portion.

9. The device of claim 1, wherein at least a portion of the casing is an ultrasonic waveguide where one of the a plurality of electronic/electrical components comprises an ultrasonic generator operatively connected to the ultrasonic waveguide for transmitting ultrasound signals into the ultrasonic waveguide, and another of the at least two electronic/electrical components comprises a detector for detecting the ultrasonic signals from the waveguide.

10. The device of claim 1, wherein the portion of the casing acting as a communication bus comprises a waveguide for transmitting the signal between the plurality of electronic/electrical components.

11. The device of claim 10, wherein the waveguide comprises an entirety of the casing.

12. The device of claim 10, wherein the casing comprises an outer portion and the waveguide is formed on an inner surface of the outer portion.

13. The device of claim 12, wherein the waveguide is formed on a majority of the inner surface of the outer portion.

14. The device of claim 12, wherein the waveguide is formed in one or more strips on the inner surface of the outer portion.

15. The device of claim 14, wherein at least one of the one or more strips is formed in a channel on the inner surface of the outer portion.

16. A device other than a projectile, the device comprising:
   means for housing a plurality of internal electronic/electrical components; and
   means for communicating a signal in a point-to-many links manner between the plurality of internal electronic/electrical components through at least a portion of the means for housing the at least two internal electronic/electrical components, wherein the communicated signal is available to each of the plurality of electronic/electrical components.

17. A device other than a projectile, the device comprising:
   a casing for holding a plurality of electronic/electrical components; and
   a communication bus formed at least in part by the casing;
   wherein the plurality of electrical/electronic components are operatively connected to the communication bus in a point-to-many links manner and capable of transmitting and detecting a signal on the communication bus and the signal is available to each of the plurality of electronic/electrical components on the communication bus.

18. A method for communicating a signal between a plurality of electronic/electrical components in a device having a casing, the device being other than a projectile, the method comprising:
   providing the casing with at least a portion acting as a communication bus; and
   operatively connecting the two or more electronic/electrical components to the communication bus such that a signal transmitted on the communication bus in a point-to-many links manner is available to each of the plurality of electronic/electrical components on the communication bus.

19. The method of claim 18, further comprising transmitting a signal on the communication bus for detection by at least one of the plurality of electronic/electrical components.

20. The method of claim 19, wherein the transmitting comprises transmitting an optical signal on the communication bus.

21. The method of claim 19, wherein the transmitting comprises transmitting an ultrasound signal on the communication bus.

22. The method of claim 18, wherein the providing comprises fabricating at least a portion of the casing from a material that acts as the communication bus.

23. The method of claim 18, wherein the operatively connecting comprises adhering at least one of the plurality of electronic/electrical components to the at least a portion of the casing acting as a communication bus.

24. The method of claim 18, wherein the operatively connecting comprises fastening at least one of the plurality of electronic/electrical components to the at least a portion of the casing acting as a communication bus.

25. A device other than a projectile, the device comprising:
- a casing for housing a plurality of electronic/electrical components;
- a communication bus disposed in the casing for operatively connecting each of the plurality of electronic/electrical components to each other in a point-to-many links manner; and
- a window formed on at least a portion of the casing through which an input signal is transmitted from an exterior of the casing to the communication bus.

26. A method for inputting a signal to an interior of a device, the device being other than a projectile, the method comprising:
- inputting a signal through at least a portion of a casing of the device having a plurality of electronic/electrical components housed therein; and
- transmitting at least a portion of the signal in a point-to-many links manner to each of the plurality of electronic/electrical components operatively connected to a communication bus.

27. The method of claim 26, wherein the signal is useful for inputting data to the internal component.

28. A device comprising:
- at least two electronic/electrical components; and
- a casing, the casing having at least a portion thereof acting as a communication bus for connecting the at least two electronic/electrical components;
- wherein the portion of the casing acting as a communication bus comprises a waveguide for transmitting signals between the at least two electronic/electrical components and the waveguide comprises an entirety of the casing.

29. A device comprising:
- at least two electronic/electrical components; and
- a casing, the casing having at least a portion thereof acting as a communication bus for connecting the at least two electronic/electrical components;
- wherein the portion of the casing acting as a communication bus comprises a waveguide for transmitting signals between the at least two electronic/electrical components, the casing comprises an outer portion and the waveguide is formed on an inner surface of the outer portion and the waveguide is formed on a majority of the inner surface of the outer portion.

* * * * *